(12) United States Patent
Ueno et al.

(10) Patent No.: US 6,669,996 B2
(45) Date of Patent: Dec. 30, 2003

(54) METHOD OF SYNTHESIZING METAL DOPED DIAMOND-LIKE CARBON FILMS

(75) Inventors: Mayumi Ueno, Sakado (JP); Mahendra Kumar Sunkara, Louisville, KY (US)

(73) Assignee: University of Louisville, Louisville, KY (US)

( * ) Notice: Subject to any disclaimer, the term of this patent is extended or adjusted under 35 U.S.C. 154(b) by 0 days.

(21) Appl. No.: 09/900,439

(22) Filed: Jul. 6, 2001

(65) Prior Publication Data

US 2003/0026921 A1 Feb. 6, 2003

Related U.S. Application Data
(60) Provisional application No. 60/216,169, filed on Jul. 6, 2000.

(51) Int. Cl.[7] ................................................. H05H 1/10
(52) U.S. Cl. ..................... 427/571; 427/577; 427/249.7
(58) Field of Search ............................ 427/249.1, 571, 427/577

(56) References Cited

U.S. PATENT DOCUMENTS

| | | | | |
|---|---|---|---|---|
| 5,249,554 A | * | 10/1993 | Tamor et al. | 123/90.51 |
| 5,277,996 A | * | 1/1994 | Marchetti et al. | 429/44 |
| 5,427,827 A | * | 6/1995 | Shing et al. | 427/577 |
| 5,653,812 A | * | 8/1997 | Petrmichl et al. | 118/723 E |
| 6,015,597 A | | 1/2000 | David | |
| 6,046,758 A | | 4/2000 | Brown et al. | |
| 6,054,331 A | | 4/2000 | Woo et al. | |
| 6,200,675 B1 | * | 3/2001 | Neerinck et al. | 427/530 |
| 6,468,642 B1 | * | 10/2002 | Bray et al. | 428/218 |

FOREIGN PATENT DOCUMENTS

| | | |
|---|---|---|
| JP | 63150926 | 6/1988 |
| JP | 1104796 | 4/1989 |
| JP | 1172203 | 7/1989 |
| JP | 10125672 | 5/1998 |
| JP | 11278990 | 10/1999 |

OTHER PUBLICATIONS

Sunkara, Mahendra K. et al., "Electrochemical Studies of Metal–Doped Diamondlike Carbon Films." New Diamond and Frontier Carbon Technology. Vol. 9 No. 6, 1999, pp. 407–415.*

Technical Publication by G. D. Liak, E. C. Dickey, M. Ueno, and M. K. Sunkara Titled "Ru–doped Nanostructured Carbon Films," in Diamond and Related Materials, 11 (2002) pp 1890–1896, by Elsevier Science B.V., (www.elsevier.com/locate/diamond.

Weng–Jin Wu, Min–Hsiung Hon, "Thermal Stability of Diamond–like Carbon Films with Added Silicon", Surface & Coatings Technology 111 (1999) 134–140.

K. I. Schiffman, M. Fryda, G. Goerigk, R. Lauer, Pittinze A. Bulack, "Sizes and Distances of Metal Clusters in Au–, Pt–, W–and Fe–Containing Diamond–like Carbon Hard Coatings: A Comparative Study by Small Angle X–ray Scattering, Wide Angle X–ray Diffraction Transmission Electron Microscopy and Scanning Tunnelling Microscopy", Thin Solid Films (1999) 60–71.

M. K. Sunkara, H. Chandrasekaran, P. Koduri, "Electrochemical Studies of Metal–Doped Diamondlike Carbon Films", New Diamond and Frontier Carbon Technology, vol. 9, No. 6(1999), 407–415.

* cited by examiner

*Primary Examiner*—Bret Chen
(74) *Attorney, Agent, or Firm*—Carrithers Law Office, PLLC; David W. Carrithers

(57) ABSTRACT

A method of synthesizing metal doped carbon films by placing a substrate in a chamber with a selected amount of a metalorganic compound. An electron cyclotron resonance is applied to the chamber in order to vaporize the metalorganic compound. The resonance is applied to the chamber until a metal doped carbon film is formed. The metalorganic compound is preferably selected from the group consisting of an organic salt of ruthenium, palladium, gold or platinum.

26 Claims, 12 Drawing Sheets

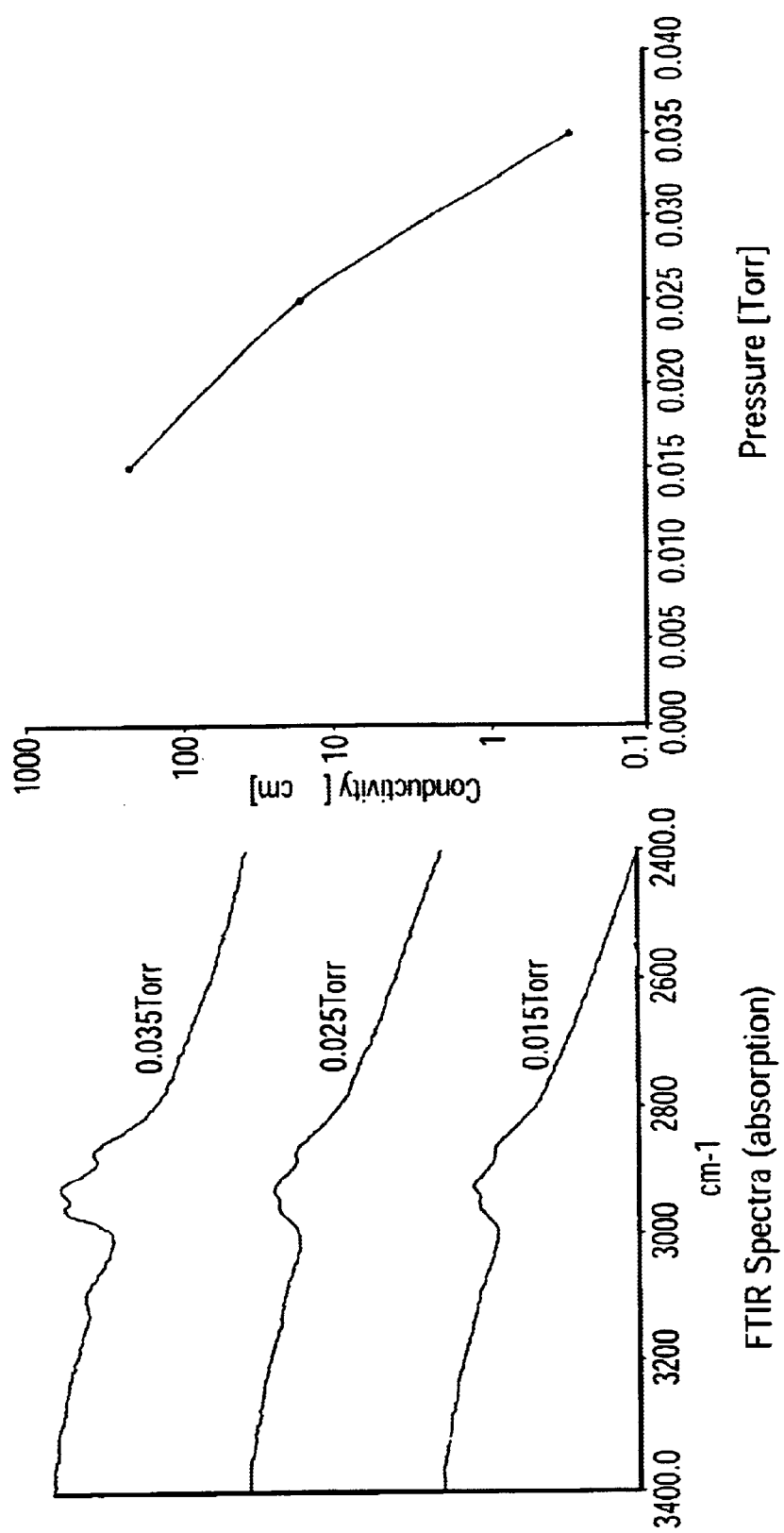

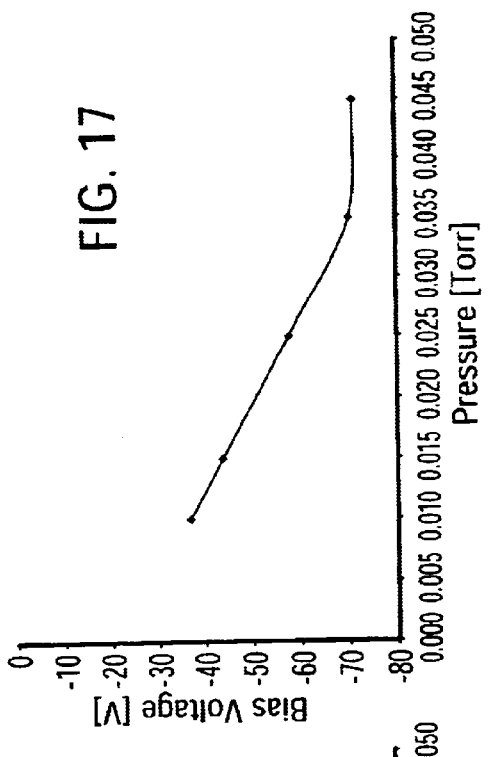
FIG. 17
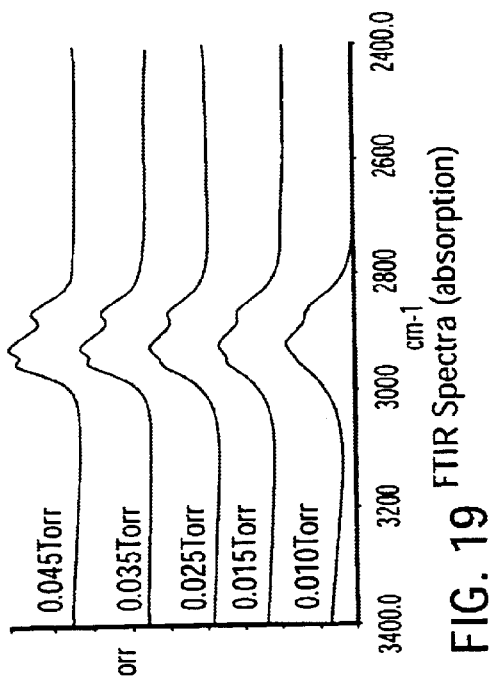
FIG. 19 FTIR Spectra (absorption)
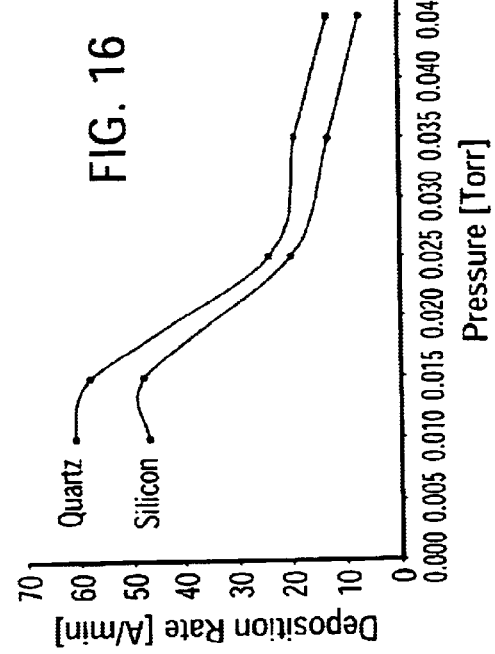
FIG. 16
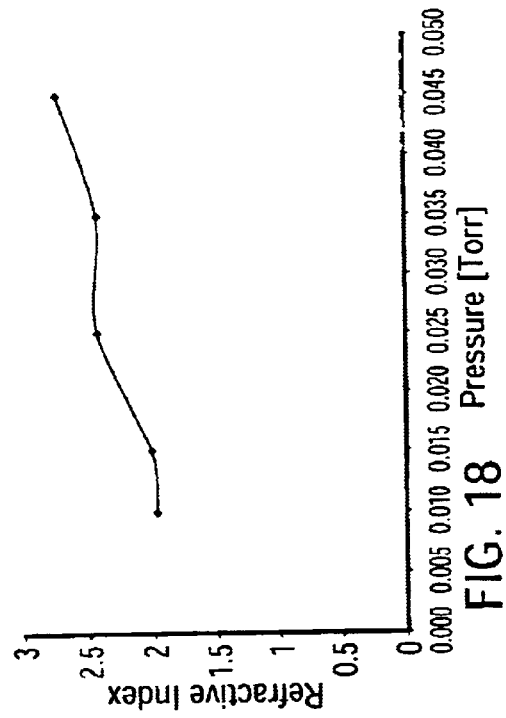
FIG. 18

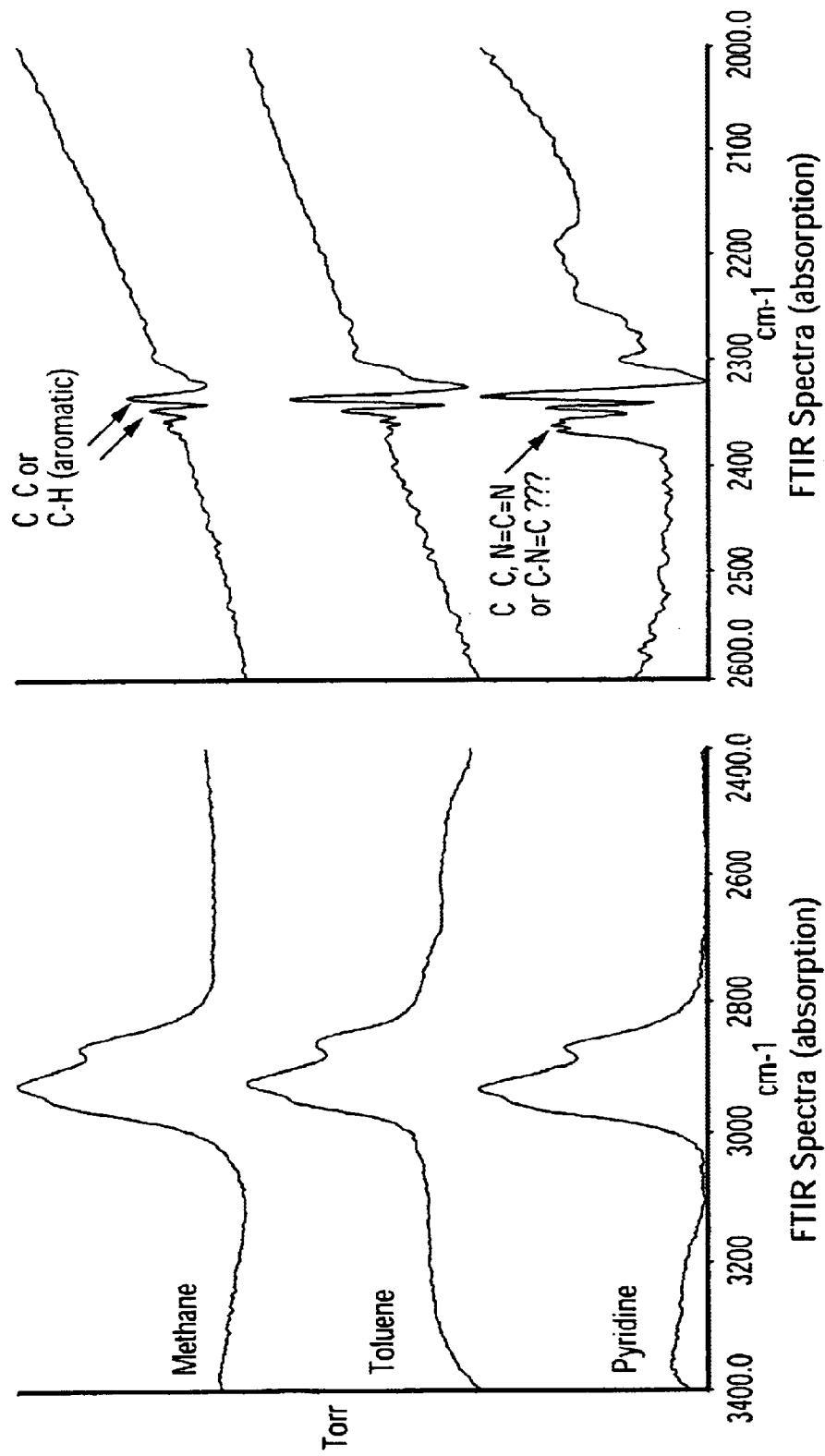

METHOD OF SYNTHESIZING METAL DOPED DIAMOND-LIKE CARBON FILMS

This application claims priority from U.S. Provisional Application Serial No. 60/216,169 filed on Jul. 6, 2000 which is hereby incorporated by reference herein.

This application is part of a government project. The research leading to this invention was supported by a Grant Number 994916 from NASA EPSCOR and 994914 from ORAU. The United States Government retains certain rights in this invention.

BACKGROUND OF THE INVENTION

1. Field of the Invention

The invention relates to a method of synthesizing metal doped diamond-like carbon films.

2. Description of the Prior Art

Metal doped diamond-like carbons films are useful as wear and corrosion resistant coatings for a wide array of devices, ranging from electrodes for electrochemistry to protection of critical components used in space shuttles. A recent development useful in the medical sciences is the use of precious metal substrates in diagnostic strips in order to isolate the reactants from contamination and improve accuracy of the test.

Current methods use co-sputtering of metal during amorphous carbon film deposition in RF plasma reactor or in a complete PVD setup to synthesize metal doped diamond-like carbon films. These methods, however, do not provide control for film composition.

The need remains to provide a method that allows independent process control of film composition to provide flexibility and/or structure modification.

SUMMARY OF THE INVENTION

The present invention is a new method for synthesizing metal-doped amorphous (diamond-like) carbon films using plasma assisted decomposition of metalorganic precursors. The invention sets forth a process of synthesizing metal doped carbon films by placing a substrate in a chamber with a selected amount of a selected metalorganic compound. An electron cyclotron resonance is applied to the chamber in order to vaporize the metalorganic compound and continued resonance may be applied to the chamber until a metal doped carbon film is formed.

More particularly, a metalorganic precursor for the desired diamond-like carbon film is treated by a electron cyclotron resonance (ECR) chemical vapor deposition (CVD) technique to form a film on a substrate. The metalorganic compound is preferably selected from the group consisting of a metal of an organic salt of ruthenium, palladium, gold or platinum. Preferred substrates are silicon and quartz. The organic moiety can be any organic compound.

A most preferred metalorganic precursor is bis-(ethylcyclopentany) ruthenium. The substrate is biased using an RF power source between −30 and −100V with respect to system ground, i.e., chamber. The flow rates were set below 5 sccm.

It is an object of the present invention to synthesize novel material systems possessing unique combination of properties including conducting and hard films, semi-conducting films, and catalytic and electrocatalytic materials.

It is an object of the present invention to improve the properties of diamond-like carbon films such as stability, wear resistance in vacuum environments and adhesion with substrates.

It is an object of the present invention to utilize metalorganic chemical vapor deposition, (MOCVD), precursor decomposition for metal doping as opposed to conventional co-sputtering methods for metal doping.

It is an object of the present invention to provide for independent controllable synthesis variables such as substrate bias, power and gas phase composition for dopant.

It is an object of the present invention to reduce contamination because no electrodes are used and the ability to use high purity source materials.

It is an object of the present invention to eliminate line of sight problems for deposition over complex geometries.

It is an object of the present invention to provide ultra thin and wear resistant coatings for scanning tunnel microscope, (SPM), probe tips.

It is an object of the present invention to provide for conduction versions for S-parameter microscopy, (SPM), specifically.

It is yet another object of the present invention to provide a means for control for film composition.

It is another object of the present invention to obtain precursor materials at a very high purity compared to sputtering targets.

These and other objects of the present invention will be more fully understood from the following description of the invention.

BRIEF DESCRIPTION OF THE DRAWINGS

A better understanding of the present invention will be had upon reference to the following description in conjunction with the accompanying drawings in which like numerals refer to like parts throughout the several views and wherein:

FIG. 14 shows a FTIR Spectra (absorption) of Ruthenium doped DLC films, wherein the DC conductivity of the films deposited over a range of pressures indicate variation of ruthenium incorporation into DLC films with operating pressure;

FIG. 15 shows pressure dependence on DLC film growth, wherein pressure in Torr, wherein the DC conductivity of the films deposited over a range of pressures indicate variation of ruthenium incorporation into DLC films with operating pressure;

FIG. 16 shows the pressure dependence on DLC film growth for quartz and silicon on DLC film growth vs Deposition Rate;

FIG. 17 shows the pressure dependence on DLC film growth as a function of voltage;

FIG. 18 shows the pressure dependence on DLC film growth vs. the refractive index;

FIG. 19 shows the pressure dependence on DLC film growth with a FTIR Spectra (absorption) graph;

FIG. 20 shows a FTIR Spectra (absorption) showing a comparison between a —C:H film deposition with toluene and a —C:H film deposition with methane and a —C:H deposition with pyridine all using the same container arrangement; and FIG. 21 shows a FTIR Spectra (absorption) for a Nitrogen doped DLC film.

DESCRIPTION OF THE PREFERRED EMBODIMENT

Figure 1:
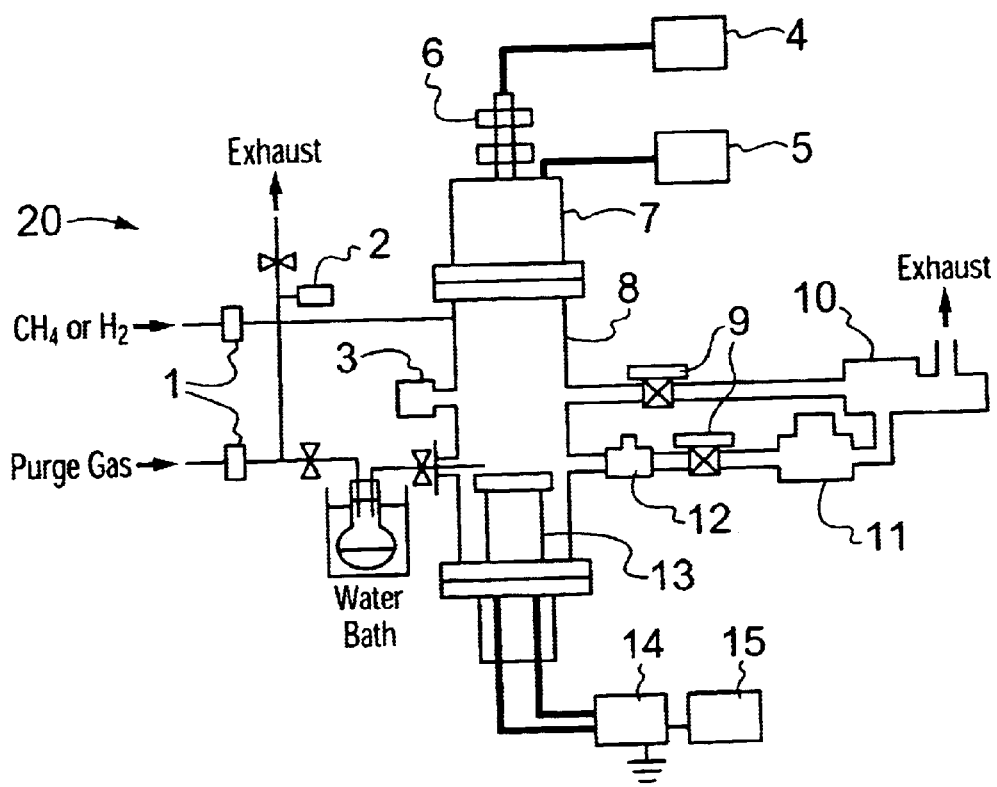
FIG. 1 shows a diagram of an electron cyclotron resonance chemical vapor deposition system used in the present process.
Figure 9:
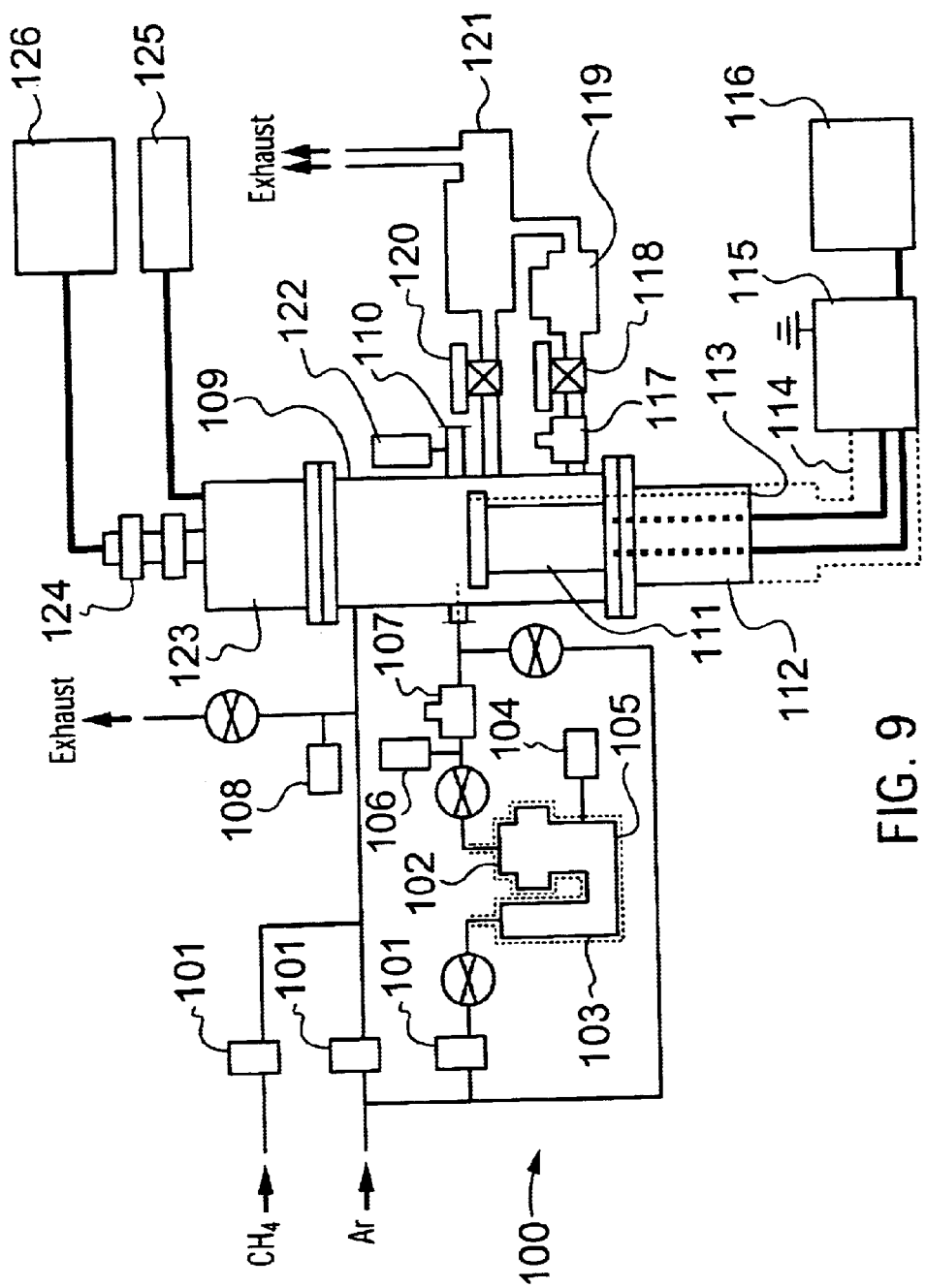
FIG. 9 shows an electron cyclotron resonance chemical vapor deposition system.

Films were synthesized using Bis-(ethylcyclopentadienyl) Ruthenium, $Ru(C_2H_5C_5H_4)_2$ as MOCVD precursor in electron cyclotron resonance (ECR) chemical vapor deposition (CVD) technique. The system used for the deposition is shown in FIGS. 1 and 9 described in detail hereafter. Since the vapor pressure of the above precursor is lower than the operating process pressure, the liquid precursor container was heated. The resulting vapor was introduced into the chamber very close to the substrate. Both silicon and quartz were tried as substrates. The substrate was biased using a RF power source between −30 and −100 V with respect to system ground, i.e., chamber. The flow rates were less than 4 sccm. The observed growth rates were on the order of 50 Angstroms/min. The deposited film possesses diamond-like, $sp^3$ carbon structure which was confirmed by Fourier Transform infrared (FTIR) Spectroscopy in accordance with FIG. 10. The scanning tunneling microscopic images shown in FIGS. 11–12 confirmed the existence of 5 nm size ruthenium metal clusters embedded in a relatively resistive carbon network. The film that was encapsulated with 5 nm diameter ruthenium clusters exhibited DC conductivity of 0.6 Ω-cm.

Equipment and Instrumentation

Microwave ECR Discharge Chemical Vapor Deposition System

The microwave electron cyclotron resonance chemical vapor deposition system 20, (ECRCVD), ECR discharge is created at the plasma source assembly (ASTeXAX4500). A 2.45 Ghz microwave power generator (ASTeX AX2000 with a maximum power supply of 250 W utilizing a coaxial slug tuner (ASTeX AX3040), and a magnet power supply (ASTeX CECRP4025) were assembled as shown in FIG. 1. The plasma chamber for the plasma source assembly comprises a quartz bell jar, which was cooperatively connected to electromagnets through a viton O-ring. The system produces the required magnetic field for microwave ECR discharge. i.e. 875 G.

More particularly, as shown in FIG. 1, the microwave ECR discharge chemical vapor deposition system utilized in the instant invention included a mass flow controller 1, conventional pressure gauge 2, Baratron pressure gauge 3, microwave generator 4, ECR power source 5, slug tuner 6, electromagnet 7, reaction chamber 8, ring bellow valve 9, rotary pump 10, turbo molecular pump 11, pressure control valve 12, copper substrate stage 13, automatic matching network 14, and RF generator 15.

Figure 2:
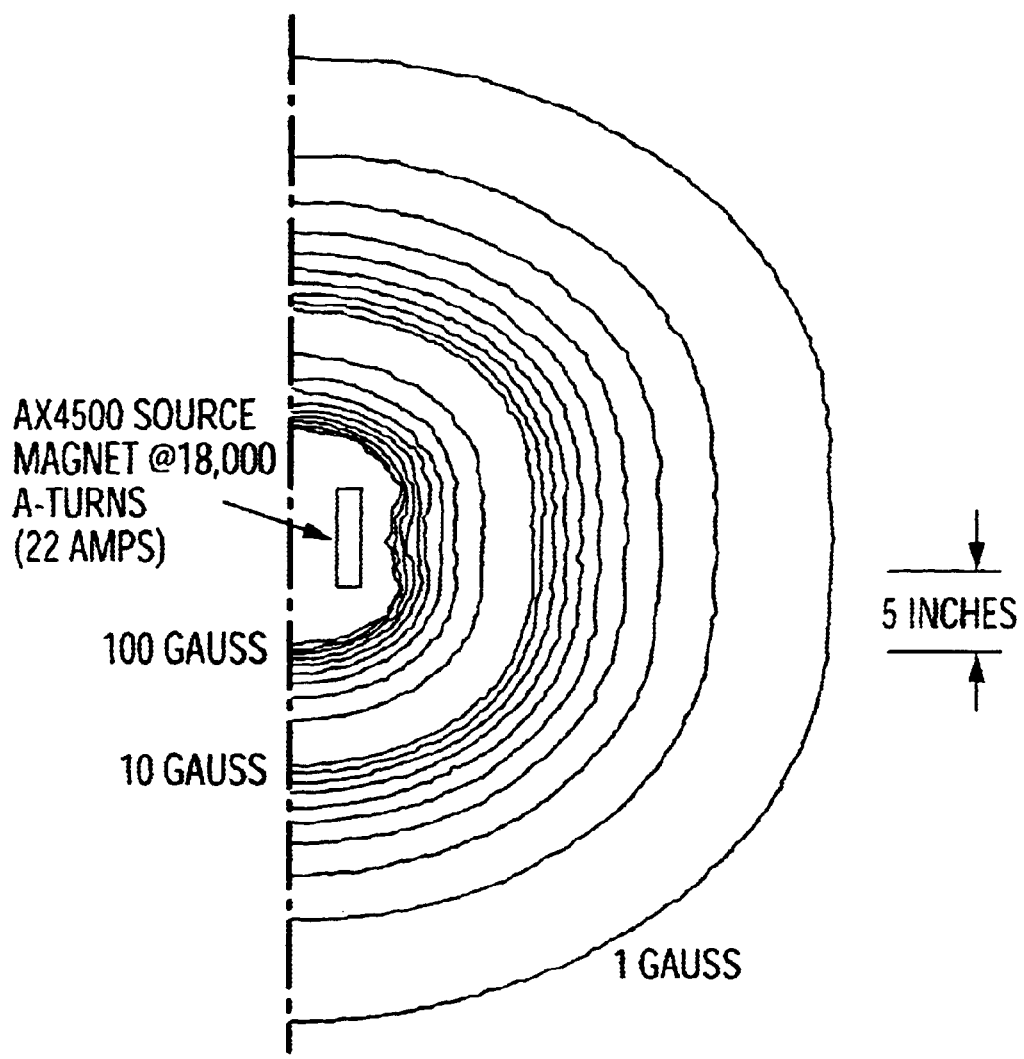
FIG. 2 shows a magnetic field intensity for AX 4500 Stray.

As illustrated in FIG. 2, the diagram shows the strength of the magnetic field near the source. The system requires a minimum 0.15 gpm of 4° C. water circling at ~40 psig for system cooling.

The plasma source assembly was placed on a stainless steel chamber with a volume of 7 L through the ISO-NW 160 vacuum flange with a viton O-ring. A copper substrate stage was placed 30 cm apart from the plasma source assembly through 8 inch flange with a copper gasket. An electrically isolated K-type thermocouple was installed on the copper substrate stage to measure the substrate temperature. Since there is a distance between the plasma chamber and the substrate stage, low temperature operation is possible in this ECR discharge system.

To provide for a precursor chemical solution, a PYREX glass container was used to contain the volatile chemical which was connected to the substrate stage through ¼ inch stainless tubing. A water bath was installed for uniform heating of the container. This arrangement prevented dissipation of the precious precursor chemical to undesired area. For additional organic precursor chemical handling and its vapor flow control, a precise pressure and temperature control system were utilized as described herein.

Magnetic Field Intensity for AX 4500 Stray

A self tuning RF matching network (Plasma-thermo AMN 1000E, input impedance 50 Ω), utilizing a RF power generator, (Plasma-thermo HPS 500S, rated power output 250 W, output impedance 50 Ω), was installed and connected to the copper substrate stage. The input impedance was transformed to reactive impedance automatically by the basic L configuration matching network assembly with a shunt capacitor to handle the loading and a fixed coil and series capacitor to handle the tuning. Water circulating for the matching network and the copper substrate stage cooling was arranged beside the ECR plasma source assembly system cooling.

DC Potential Measurement

Figure 3:
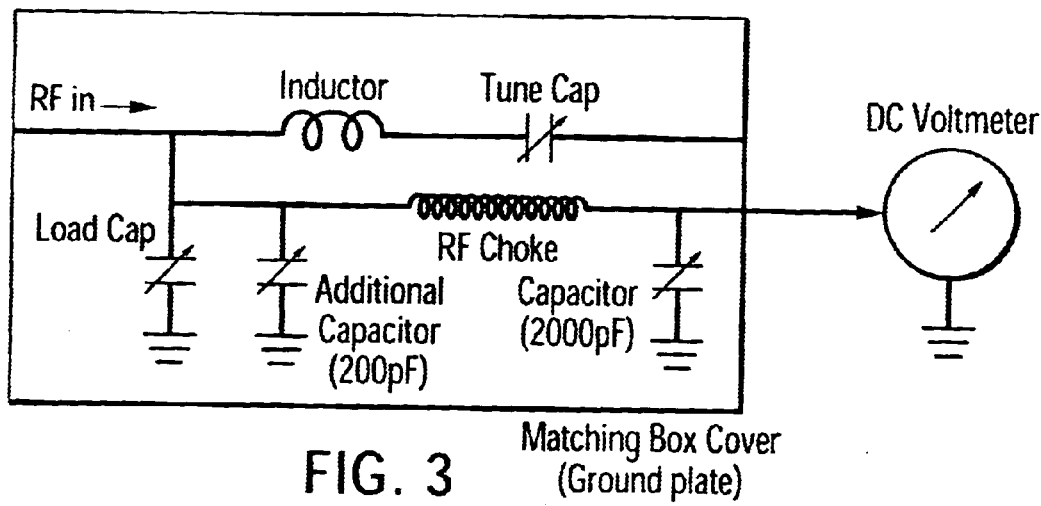
FIG. 3 shows a DC potential measurement for measuring DC substrate voltage by the introduced choke and capacitor, which are connected in series and in parallel, respectively, to the ground.

RF power employed in this system for providing a negative substrate bias was 13.56 MHz by following the government communications regulations. The copper substrate stage, which acted as a powered electrode (cathode), was grounded as well as the stainless chamber wall (anode). Since the cathode is powered more positively relative to the ground, it will rapidly correct electrons because the electrons respond faster than the ions, which are too massive to move freely, to the applied high voltage. The DC substrate voltage can be measured by the introduced choke and capacitor, which are connected in series and in parallel, respectively, to the ground as shown in FIG. 3. The choke filters RF voltage and any left over would be shunted to the ground by the large capacitor.

ECR Plasma with Argon Created at .0.10 Torr

Figure 4:
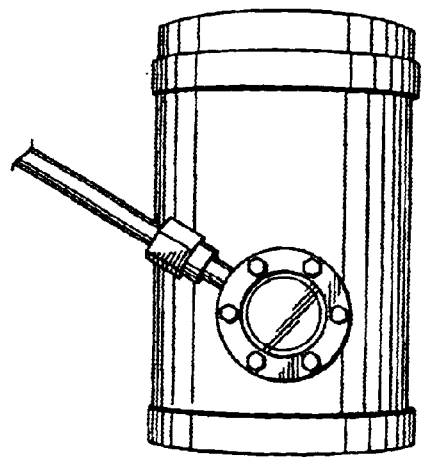
FIG. 4 shows an ECR Plasma Chamber for providing low pressure operation for creating an Ar microwave ECR discharge plasma.

System purge, which eliminates any reactive species in the system, is extremely important for CVD processing. For this purpose, the CVD system must be vacuumed down to the base pressure before the chemical is applied. In this system, the base pressure of less than $10^{-4}$ Torr was produced by a rotary vane pump (ALCATEL 2033CP+, pumping speed 12.7 L/s) and a turbo molecular pump (ALCATEL ATP-80, pumping speed: 80 L/s). The purge line was arranged to fill the system with inactive gas, as shown in FIG. 1. Processing gas flow was controlled by mass flow controllers (MKS 1179A, maximum flow rate: 100 SCCM) connected to the process chamber through ¼ inch stainless steel tubing. A throttle valve (MKS 253B, minimum control range; 0.1 mTorr) and a pressure transducer (MKS 627A, maximum reading: 1 Torr), which monitor the pressure and also input the control signal to the throttle valve, was installed to perform a system pressure control. This vacuum system allowed low pressure operation, where ECR discharge can be efficient. The Ar microwave ECR discharge plasma was created at a pressure of 0.010 Torr is shown in FIG. 4.

Film Thickness and Optical Constant Measurement System

Figure 5:
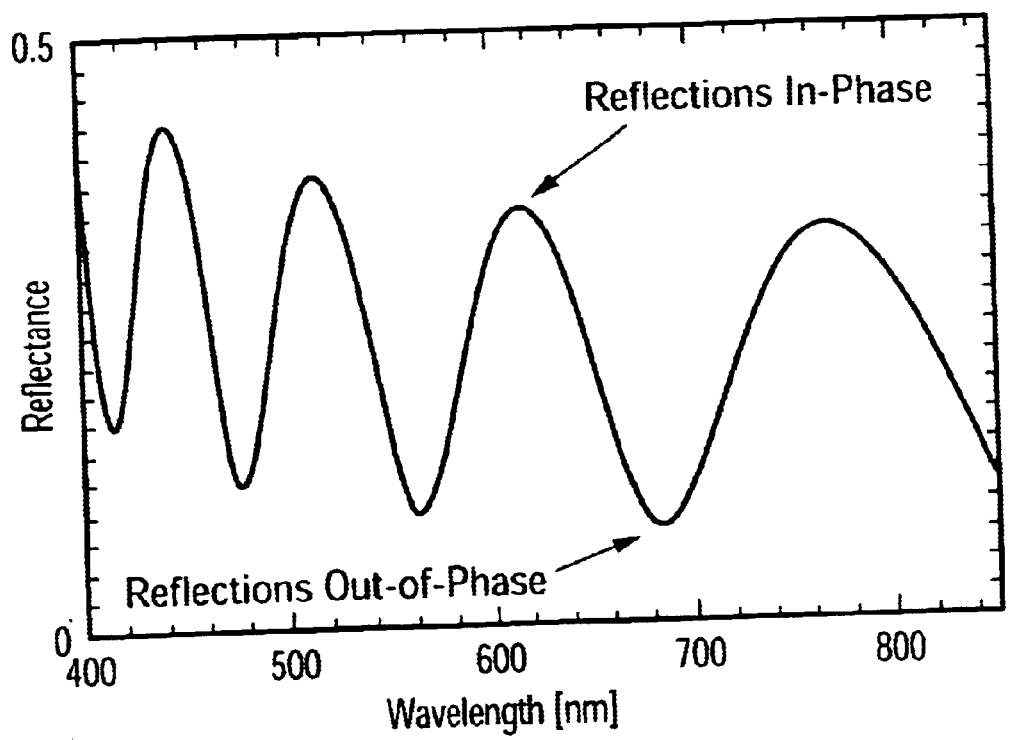
FIG. 5 is a graph of Reflectance Spectrum with Oscillations showing characteristic intensity oscillations in the reflectance spectrum.

FILMETREX F20 measures thin-film characteristics by either reflecting or transmitting light though the sample, and then analyzing this light over a range of wave lengths. Because of its wave-like properties, light reflected from the top and bottom interfaces of a thin film can be in-phase so that reflections add, or out-of-phase so that reflections subtract. Whether the reflections are in or out-of-phase (or somewhere in between) depends on the wavelength of the light, as well as the thickness and properties of the film (e.g., reflections are in-phase when $\lambda=(2*n*d)/i$, where $\lambda$ is the wavelength, n is the reflective index, d is the film thickness, and i is an integer.) The result is characteristic intensity oscillations in the reflectance spectrum as shown in FIG. 5 showing reflections in-phase and reflections out-of-phase. In general, the thicker the film, the more oscillations there are in a given wavelength range.

The amplitude of the oscillations was determined by the refractive index and extinction coefficient of the films and substrate. Therefore, by analyzing the periods and amplitude of these oscillations, thickness and optical properties (n and k) of thin films were determined.

To determine film thickness, a reflectance spectrum that matches as closely as possible the measured spectrum is calculated. It is begun with an initial guess for what the reflectance spectrum should look like theoretically, based on the film structure for the sample. Then, the parameter is varied until the calculated reflectance spectrum matches the measured data. Mathematically, this procedure is complicated by the fact that as the thickness of the films in the calculation is varied, there can be many near matches. Therefore, an approach that simply homes in on a solution by finding successively better approximations do not work unless the starting guess for optical thickness is within approximately 1000 A if the actual thickness.

Measurement of optical constants (refractive index and extinction coefficient, also called n and k) requires a simultaneous determination of film thickness. The techniques used to determine film thickness and optical constants is the same as that used to measure thickness alone, except that now n and k are also varied to optimize the match between calculated and measured reflectance spectra.

Since n and k varies as a function of wave length, it is necessary to solve for them at every wavelength. For a completely unknown material, it is not possible to do this using a reflection spectrum only since at each wavelength only on know parameter (reflectance) is known and there are two unknowns (n and k). However, n and k are not independent, but are related to each other via what is known as the Krames-Kroning relation. If n were known at all wavelength, k could be computed solely from n. Since it is only possible to measure n over a finite wavelength range, k cannot be computed directly from n.

Fourier Transform Infrared Spectroscopy

Figure 6:
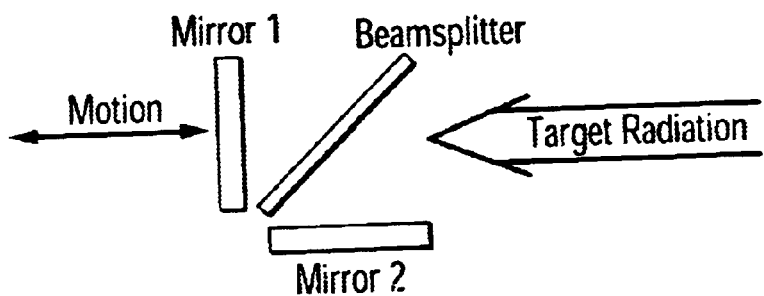
FIG. 6 is FTIR (Fourier Transform Infrared) or FTS (Fourier Transform Spectroscopy) which is a sensor technology based on the Michelson interferometer showing two flat mirrors located at 90° to each other with a beam splitter mounted on the 45° line which separates the two mirrors.

FTIR (Fourier Transform Infrared) or FTS (Fourier Transform Spectroscopy) is a sensor technology based on the Michelson interferometer. Historically the Michelson interferometer consists of two flat mirrors located at 90° to each other with a beam splitter mounted on the 45° line which separates the two mirrors as shown in FIG. 6. Generally one of the mirrors is fixed and the other mirror is mounted such that it can be translated while maintaining the precision alignment relative to the fixed mirror.

The Michelson interferometer modulates the incoming optical radiation by changing the optical path difference (OPD) between the two possible paths in the interferometer in a smooth (some FTIR sensor do use a step scan approach) continuous fashion. As described above, the interferometer is made up of two mirrors oriented 90° to each other and separated by a beam splitter/compensator pair. A change in path difference (called retardation) is accomplished by moving one of the two mirrors at a constant velocity over a fixed distance. When the mirror has traveled the required distance, which is governed by the required spectral resolution, it is quickly returned to the start position to begin the next scan. During the motion of the moving mirror each wavelength of the collected radiation is modulated at a unique frequency that is a function of the wavelength of the radiation and the velocity of the moving mirror.

Basic Configuration for FT-IR

For example, if a laser (10 $\mu$m $CO_2$) was used as the source of radiation and the interferometer mirror was moving at 10 cm/sec (optical), the signal generated would be a sine wave of constant amplitude and constant ($\{1/10\,\mu m\} \times 10$ cm/sec=10 kHz) frequency. Assuming a broadband source such as a black body, taking into account all the wavelengths which make up the target radiation and adding together all these sinusoids produce what is called an interferogram. Therefore, the interferogram is a coded representation of the target spectrum. The Fourier Transform or decoding of the interferogram provides the spectrum of the target radiation. These sensors are used primarily in the infrared portion of the spectrum, where the detectors require their sensitivity advantage; and are therefore called Fourier Transform Infrared Spectrometers.

Michelson interferometers provide a significant sensitivity advantage over grating, prism, and circular variable filter (CVF) spectrometers. There are two significant reasons for the sensitivity advantage. The first can be described as a mulitplex advantage. The Michelson interferometer's single detector views all the wavelengths (within the sensor passband) simultaneously throughout the entire measurement. This effectively lets the detector "dwell" on each wavelength for the entire measurement time, measuring more photons. This improvement is called the multiplex advantage and, in effect, increases the integration time. The second advantage is due to the light gathering capability or larger throughput. The interferometer is not limited in aperture (slit width or height) as severely as dispersive or CVF instruments. This translates into a much higher throughput or light gathering capability. Both of these advantages enable the Michelson FTIR to provide superior sensitivity over other spectrometers over the infrared portion of the spectrum.

Scanning Tunneling Microscope

Scanning tunneling spectroscopy (STS) studies the local electronic structure of a sample's surface. The electronic structure of an atom depends upon its atomic species and also upon its local chemical environment (how many neighbors it has, what kind of atoms they are, and the symmetry of their distribution).

Figure 7:
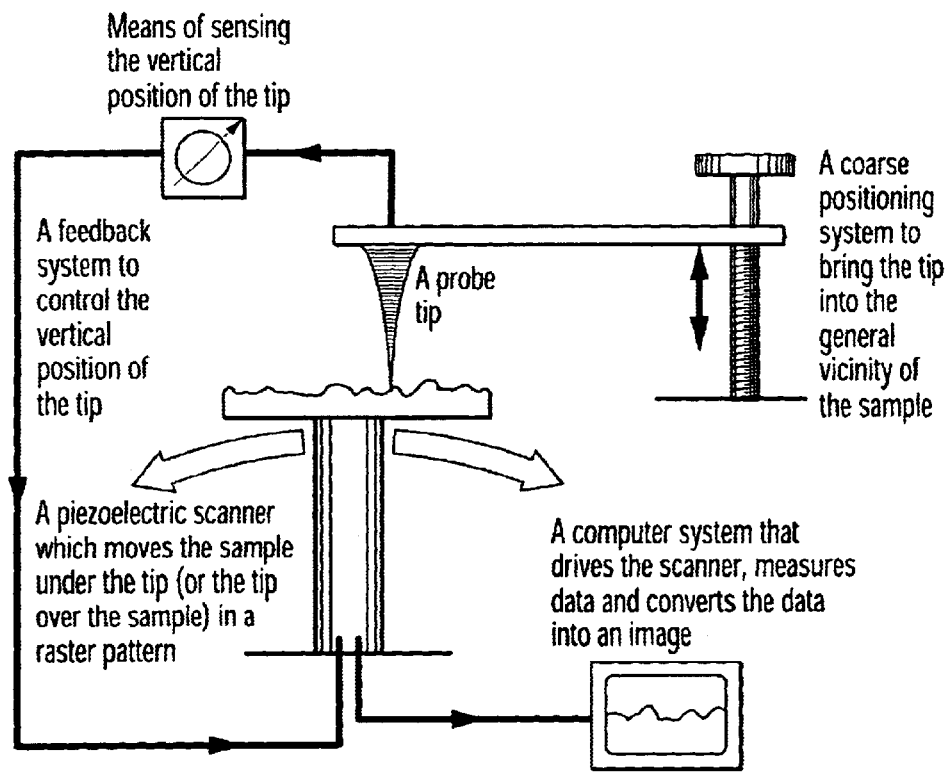
FIG. 7 shows a scanning tunneling microscope system.

As illustrated by FIG. 7, the scanning tunneling microscope system, ("STS"), of the present invention encompasses many methods: taking "topographic" (constant-current) images using different bias voltages and comparing them; taking current (constant-height) images at different heights; and ramping the bias voltage with the tip positioned over a feature of interest while recording the tunneling current. The last example results in current vs. voltage (I-V) curves characteristics of the electronic structure at a specific x,y location on the sample surface. Scanning tunneling microscope (STM) can be set up to collect I-V curves at every point in a data set, providing a three-dimensional map of electronic structure with a system in FIG. 7. With a lock-in amplifier, dI/dV (conductivity) or dI/dz (work function) vs. V curves can be collected directly. All of these are ways of probing the local electronic structure of a surface using an STM.

Figure 8:
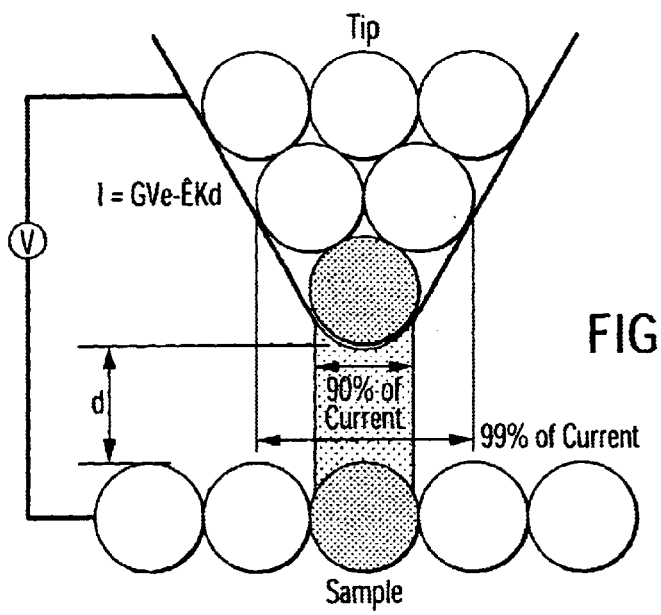
FIG. 8 shows a schematic of a scanning tunneling microscope tip and sample interaction.

STMs use a sharpened, conducting tip with a bias voltage applied between the tip and the sample. When the tip is brought within about 10 Å of the sample, electrons from the sample begin to "tunnel" through the 10 Å gap into the tip or vice versa, depending upon the sign of the bias voltage as best shown in FIG. 8. The resulting tunneling current varies with tip-to-sample spacing, and it is the signal used to create an STM image. For tunneling to take place, both the samples and the tip must be conductors or semiconductors. Unlike AFMs, which are discussed hereafter, STMs cannot image insulating materials.

STMs can be designed to scan a sample in either of two modes: constant-height or constant-current mode. In constant-height mode, the tip travels in a horizontal plane above the sample and the tunneling current varies depending on topography and the local surface electronic properties of the sample. The tunneling current measured at each location on the sample surface constitute the data set, the topographic image. In constant-current mode, STMs use feedback to keep the tunneling current constant by adjusting the height of the scanner at each measurement point. For example, when the system detects an increase in tunneling current, it adjusts the voltage applied to the piezoelectric scanner to increase the distance between the tip and the sample. In constant-current mode, the motion of the scanner constitutes the data set. If the system keeps the tunneling current constant to within a few percent, the tip-to-sample distance will be constant to within a few hundredths of an angstrom.

Each mode has advantages and disadvantages. Constant-height mode is faster because the system doesn't have to move the scanner up and down, but it provides useful information only for relatively smooth surfaces. Constant-current mode can measure irregular surfaces with high precision, but the measurement takes more time.

As a first approximation, an image of the tunneling current maps the topography of the sample. More accurately, the tunneling current corresponds to the electronic density of states at the surface. STMs actually sense the number of filled or unfilled electron states near the Fermi surface, within an energy range determined by the bias voltage. Rather than measuring physical topography, it measures a surface of constant tunneling probability.

Chemical Constituents

Pyridine, $C_5H_5N$, is commonly used base solvent. It is clear, nearly colorless liquid with melting point of $-42°$ C., boiling point at 760 Torr is $115°$ C. The carbon nitrogen triple bonds in pyridine molecular tend to be preserved in N-a-C:H film and play a role in the delocalization of $\pi$ electrons. Therefore, different doping effect is anticipated compare to doping by nitrogen gas. The vapor pressure is determined by following Antoine equation $$\log_{10}P = 33.5541 - \frac{3.1318 \times 10^3}{T} -$$
$$8.8646\log_{10}T + 7.1293 \times 10^{-12}T + 2.2813 \times 10^{-6}$$
$$(232 < T < 620)$$

where P is the pressure in Torr and T is the temperature in K.

Bis-(cyclopentdienyl)-ruthenium, $Ru(C^5H^4C^2H^5)^2$, is novel material which has been synthesized and proposed as CVD precursor for Ru or $RuO_2$ electrode recently. It is yellow liquid at room temperature and the melting point is $6°$ C. The molecular weight measurement by melting point descent method indicates its monomeric molecular configuration in benzene solution, therefore, the molecule must be monometric in gas phase also. Since it can be refined by evaporation, its purity determined by inductively coupled plasma spectroscopy (ICP) analysis is more then 99.99%. The vapor pressure measured by gas saturation method is given by following Clausius-Clapeyron equation:

$$\log_{10}P + -\frac{3708}{T} + 9.75 \qquad (323 < T < 393)$$

where P is the pressure in Torr and T is the temperature in K. The heat of vaporization is 17.0 kcal/mol.

Procedure

A n-type <100> silicon wafer and a quartz glass were employed as a substrate for all of the deposition. The silicon wafer substrate was base cleaned with $NH_4OH_1$ $H_2O_2$ and DI water mixture solution at $70°$ C. for 15 min, then, acid cleaned with dilute hydrofluoric acid prior to the film deposition. The quartz substrate was ultrasonic cleaned with Acetone and washed with DI water, then, dried at $120°$ C. to eliminate adhered moisture prior to the film deposition. Small potion of quartz substrate was covered with weak adhesive vinyl tape for thickness measurement. The substrates were placed on the copper substrate stage. The chamber was vacuumed down to the base pressure $(,10^{-4} Torr)$ with turbo pump assisted by rotary vane pump.

Substrates were Ar plasma cleaned for 2 minutes before process gas(es) was introduced. Methane was introduced for a-C:H deposition. Pyridine vapor and $Ru(C_5H_4C_2H_5)_2$ vapor were introduced near the substrate stage from the PYREX glass container. Hydrogen was also introduced with pyridine vapor. The partial pressure of Pyridine was kept constant by leaking the vapor with a bellows leak valve connected to the PYREX glass container. Since the vapor pressure of $Ru(C_5H_4C_2H_5)_2$ at room temperature is much lower than the process pressure, its PYREX glass container was heated in a water bath maintained at 100° C., and the bellows leak valve was fully opened during the deposition. Toluene was also used for a-C:H film deposition with same container arrangement for comparison to a-C:H film deposited from methane. The parameter for each deposition is shown in Table 1 as follows:

TABLE 1

Process Parameter for Each Deposition

| Source | Methane | Toluene | Pyridine | Ru |
|---|---|---|---|---|
| Flow Rate | 5 sccm | $P_{H2}:P_{tol}$ = 1.3 | $P_{H2}:P_{pyr}$ = 4:1 | <5 sccm |
| Other Gas | No | H2:3 sccm | H2:10 sccm | No |
| Deposition Time | 180 min | 60 min | 60 min | 60 min |
| Substrate Temp. | 32–37° C. | 31° C. | 34° C. | 35–39° C. |
| Microwave Power | Varied | 150 W | 150 W | 200 W |
| Process Pressure | Varied | 0.025 Torr | 0.025 Torr | Varied |

Thickness of the films deposited on silicon substrate was measured by thin film measurement system, FILMETRICS F20, which also gives corresponding refractive index. A contact type depth profile meter was used for measurement of the thickness for the films deposited on quarts substrates. The bonding structure of carbon in the film was confirmed by FT-R spectroscopy (PERKIN-ELMER). DC conductivity measurement was done for ruthenium doped films deposited on quartz substrate by four point prove technique. Scanning tunneling microscopic (STM) images of the ruthenium doped films were obtained by Scanning prove microscopy (S.M.) (Park Scientific Instruments) with tungsten tip prepared by a tip etcher with potassium hydroxide ("KO").

Confirmation of Results

Film was synthesized using bis-(ethylcyclopentany) ruthenium in the electron cyclotron resonance chemical vapor deposition system 100, ("ECR/CVD"), system shown in FIG. 9. The system in FIG. 9 includes a mass flow controller 101, PYREX glass babbler 102, rope heater 103, temperature controller 104, J-type thermocouple 105, Baratron capacitance manometer 106, all metal seal pressure control valve 107, convection gauge 108, reactor chamber 109, quartz view port 110, copper substrate stage 111, cover 112, K-type thermocouple 113, cathode ground 114, automatic matching network 115, RF generator 116, pressure control valve 117, gate valve, 118, turbo molecular pump 119, ring bellow valve, 120, mechanical pump 121, Baratron capacitance manometer 122, magnetic field 123, slug tuner, 124, ECR power generator 125, and microwave generator 126.

Figure 10:
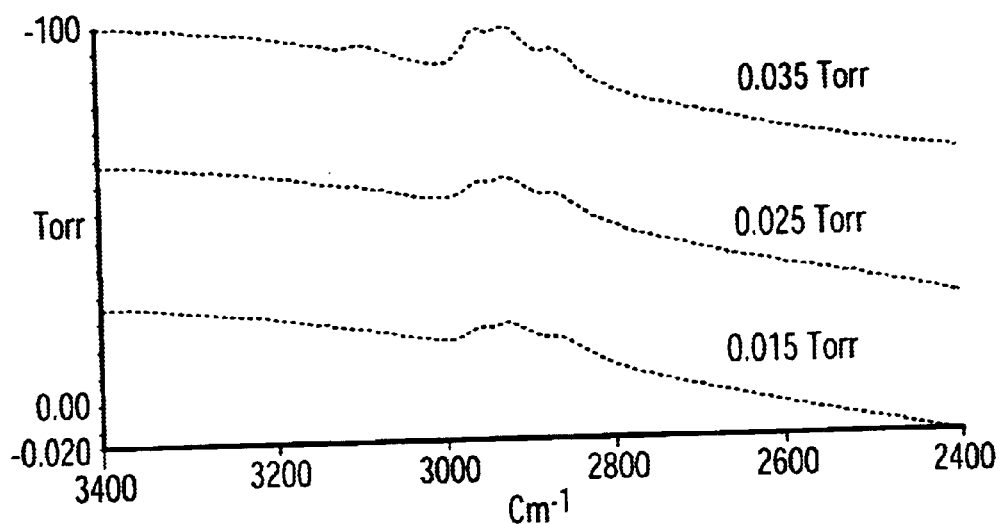
FIG. 10 shows the Fourier Transform Infrared, (FTIR), Spectra of ruthenium doped diamond-like carbon film.

The substrate was biased using an RF power source between −30 and 100V with respect to the system ground, i.e., chamber. The flow rate was set at less than 5 sccm. The growth rate was on the order of 50 Angstroms/minute. The deposited film possessed diamond-like, $sp^3$ carbon structure which was confirmed by Fourier transform infrared (FTIR) spectroscopy as seen in FIG. 10.

Figure 11:
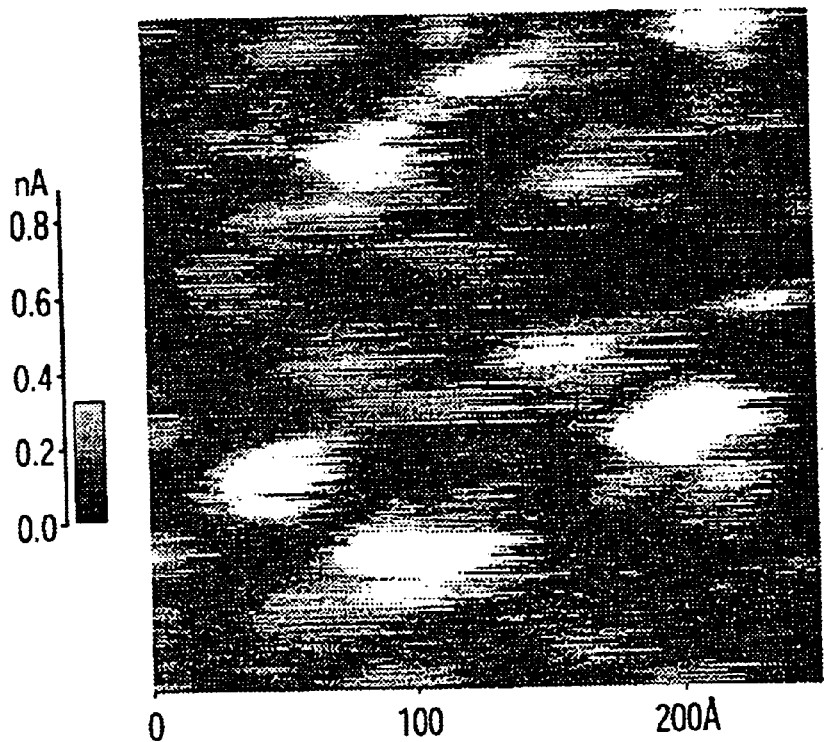
FIG. 11 shows a scanning tunneling microscope image of ruthenium doped diamond-like carbon films.
Figure 12:
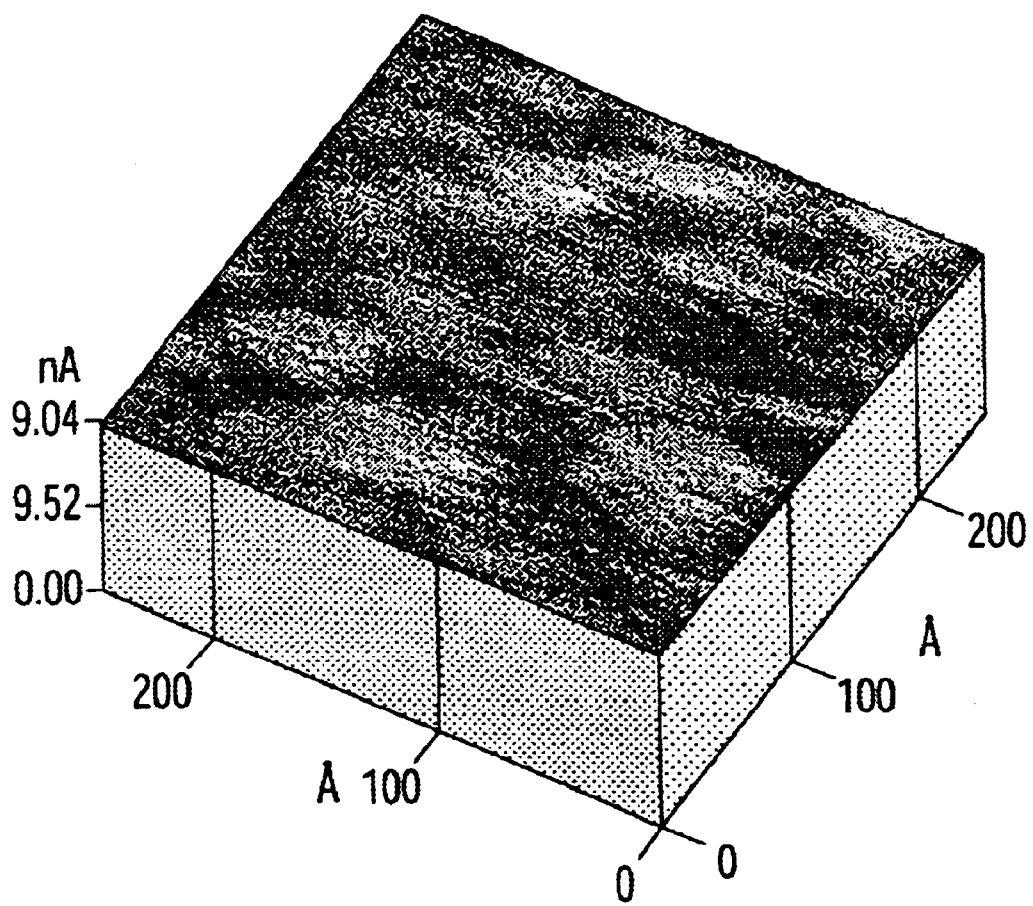
FIG. 12 shows a scanning tunneling microscope image of ruthenium doped diamond-like carbon films.
Figure 13:
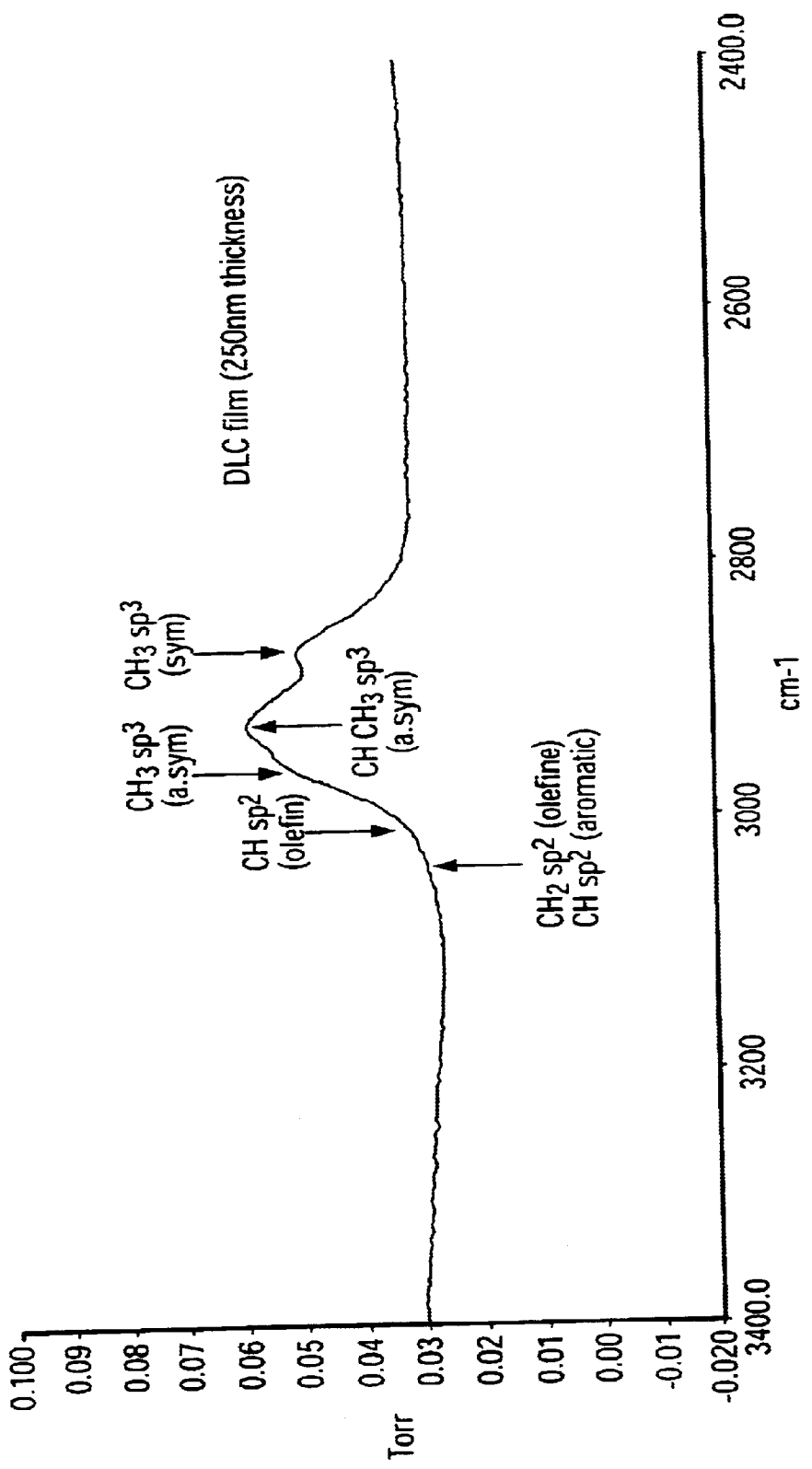
FIG. 13 shows an FTIR spectrum (absorption) of Un-doped DLC film deposited using methane at 0.025 Torr, 150 W microwave power.

Scanning tunneling microscopic images confirmed the existence of 5 nm size ruthenium metal clusters embedded in a relatively resistive carbon network. As illustrated in FIGS. 11–12, the scanning tunneling microscopy show photomicrographs wherein the bright color regions indicate higher current regions resulting with ruthenium metal clusters embedded in the DLC structure, wherein the average diameter of the ruthenium clusters is about 5 nanometers (nm). The film that is encapsulated with 5 nm diameter ruthenium clusters exhibited DC conductivity of 0.6 Ω-cm.

The experiments indicate the new synthesis route demonstrated for metal doped diamond-like carbon films result in films having diamond-like character with dispersion of 5 nm sized clusters. The feasibility of ruthenium nano-cluster encapsulation inside diamond-like carbon networks using MOCVD precursor decomposition in a ECR plasma reactor has been demonstrated by the instant method which can easily be utilized for other precious metals such as gold, palladium and platinum.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented hereinabove. Rather, what is intended to be covered is within the spirit and scope of the appended claims.

We claim:

1. A method of controlling the formation of a nanostructured metal doped carbon film comprising a diamond-like $sp^3$ carbon structure containing nanometer sized metal clusters embedded in an amorphous carbon matrix by electron cyclotron resonance chemical vapor deposition, comprising the steps of:

placing a substrate in a chamber;

maintaining said substrate temperature at a selected temperature;

introducing a ruthenium compound in said chamber near a plasma discharge as a precursor gas;

heating and vaporizing said precursor gas to increase the vapor pressure to maintain at least a minimum selected flow rate near the substrate by applying an electron cyclotron resonance to said chamber;

generating, applying, and maintaining a selected pressure;

generating and applying a RF bias of less than −200 volts;

producing a ruthenium doped film containing diamond-like metal nanocrystallite clusters within an amorphous carbon matrix having a mean grain size averaging 5 nm in diameter based on measurements on 50–100 grains.

2. The method of claim 1 wherein the substrate is selected from the group consisting of silicon and quartz.

3. The method of claim 1, wherein said ruthenium compound comprises bis-(ethylcylopentadienyl)-ruthenium.

4. The method of claim 1 wherein said flow rate is 5 sccm or less.

5. The method of claim 1 wherein the selected pressure is up to 0.025 Torr.

6. The method of claim 1, wherein said electron cyclotron resonance is generated by using up to 200 watts of microwave power.

7. The method of claim 1, wherein said substrate temperature is maintained at from between 35 and 39° C.

8. The method of claim 1, wherein said precursor gas is heated up to 100° C.

9. The method of claim 1, wherein said RF bias is generated in a range of between −30 and −100 volts.

10. The method of claim 1, wherein the growth of said ruthenium doped film containing diamond nanocrystallites within an amorphous carbon matrix is controlled by controlling the RF bias.

11. The method of claim 1, wherein said ruthenium doped film containing noncrystalline grains within an amorphous matrices have a conductivity ranging from 1 to about $10^5 \Omega^{-1} \cdot cm^{-1}$ as a function of doping level.

12. The method of claim 1, wherein said ruthenium doped film containing noncrystalline grains within an amorphous matrices with ruthenium clusters having an average diameter of 5 nm exhibits DC conductivity of $0.6^5 \Omega^{-1} \cdot cm^{-1}$.

13. A method of controlling the formation of a nanostructured metal doped carbon film comprising a diamond-like $sp^3$ carbon structure containing nanometer sized metal clusters embedded in an amorphous carbon matrix by electron cyclotron resonance chemical vapor deposition, comprising the steps of:

placing a substrate in a chamber;

maintaining said substrate temperature at a selected temperature;

introducing a metalorganic compound is said chamber near a plasma discharge as a precursor gas, wherein said metalorganic compound is selected from the group consisting of a metal or an organic salt of ruthenium, palladium, gold, and platinum;

heating and vaporizing said precursor gas to increase the vapor pressure to maintain at least a minimum selected flow rate near the substrate by applying an electron cyclotron resonance to said chamber;

generating and applying and maintained a selected pressure;

generating and applying a RF bias of less than −200 volts;

producing a metal doped film containing diamond-like metal nanocrystallite clusters within an amorphous carbon matrix.

14. The method of claim 13 wherein the gas precursor is selected from group consisting of is methane, toluene, pyridine, and ruthenium.

15. The method of claim 13 wherein the substrate is selected from the group consisting of silicon and quartz.

16. The method of claim 13 wherein the gas precursor is selected from group consisting of is methane, toluene, pyridine, and ruthenium.

17. The method of claim 13 wherein said flow rate is 5 sccm or less.

18. The method of claim 13 wherein the selected pressure is up to 0.025 Torr.

19. The method of claim 13, wherein said electron cyclotron resonance is generated by using up to 200 watts of microwave power.

20. The method of claim 13, wherein said substrate temperature is maintained at from between 35 and 39° C.

21. The method of claim 13, wherein said precursor gas is heated up to 100° C.

22. The method of claim 13, wherein said RF bias is generated in a range of between −30 and −100 volts.

23. The method of claim 13, wherein the growth of said ruthenium doped film containing diamond nanocrystallites within an amorphous carbon matrix is controlled by controlling the bias.

24. The method of claim 13, wherein said ruthenium doped film containing noncrystalline grains within an amorphous matrices have a conductivity ranging from 1 to about $10^5 \Omega^{-1} \cdot cm^{-1}$ as a function of doping level.

25. The method of claim 13, wherein said ruthenium compound comprises bis-(ethylcylopentadienyl)-ruthenium.

26. The method of claim 13, wherein said ruthenium doped film containing noncrystalline grains within an amorphous matrices with ruthenium clusters having an average diameter of 5 nm exhibits DC conductivity of $0.6^5 \Omega^{-1} \cdot cm^{-1}$.

* * * * *